(12) United States Patent
Liu et al.

(10) Patent No.: US 10,503,030 B2
(45) Date of Patent: Dec. 10, 2019

(54) PIXEL STRUCTURE AND DISPLAY PANEL THEREOF

(71) Applicant: AU OPTRONICS CORPORATION, Hsin-Chu (TW)

(72) Inventors: Wei-Hsun Liu, Hsin-Chu (TW); Kuei-Bai Chen, Taiwan (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/152,985

(22) Filed: Oct. 5, 2018

(65) Prior Publication Data

US 2019/0129260 A1 May 2, 2019

(30) Foreign Application Priority Data

Nov. 1, 2017 (TW) .............................. 106137797 A

(51) Int. Cl.
*G02F 1/1343* (2006.01)
*G02F 1/1362* (2006.01)
(Continued)

(52) U.S. Cl.
CPC .. *G02F 1/134327* (2013.01); *G02F 1/136286* (2013.01); *G02F 1/1368* (2013.01);
(Continued)

(58) Field of Classification Search
CPC ......... G02F 1/134363; G02F 1/136286; G02F 1/1368; G02F 1/136227; G02F 1/134309; G02F 1/133345; G02F 1/13439; G02F 1/133707; G02F 1/134336; G02F 1/1362; G02F 1/1343; G02F 1/155; G02F 1/13; G02F 1/1333; G02F 1/134327; G02F 1/133512; G02F 2001/134318;
(Continued)

(56) References Cited

U.S. PATENT DOCUMENTS 7,535,519 B2  5/2009 Lin
7,705,950 B2  4/2010 Lin
(Continued)

FOREIGN PATENT DOCUMENTS

TW        1582506 B    5/2017

*Primary Examiner* — Thoi V Duong
(74) *Attorney, Agent, or Firm* — Tim Tingkang Xia, Esq.; Locke Lord LLP

(57) ABSTRACT

A pixel structure includes a substrate, a scan line disposed on the substrate, and a common electrode and a data line both disposed on a side of the pixel electrode. The substrate includes a sub pixel, which includes a pixel electrode and an active element. The common electrode includes a first connection segment connecting a first segment and a second segment. The data line includes a second connection segment connecting a first section and a second section. The first segment and the second segment, as well as the first section and the second section, extend in a first direction and are alternately arranged in a second direction. The first direction intersects with the second direction. The first connection segment mutually intersects with the second connection segment. The pixel electrode overlaps with a part of the common electrode and a part of the data line in a perpendicular projection direction.

18 Claims, 10 Drawing Sheets

(51) Int. Cl.
　　　*G02F 1/1368*　　　(2006.01)
　　　*G02F 1/1335*　　　(2006.01)
　　　*H01L 27/12*　　　(2006.01)

(52) U.S. Cl.
　　　CPC .... *G02F 1/13439* (2013.01); *G02F 1/133512* (2013.01); *G02F 2001/134318* (2013.01); *G02F 2201/40* (2013.01); *H01L 27/124* (2013.01)

(58) Field of Classification Search
　　　CPC .......... G02F 2001/134345; G02F 2001/13606; G02F 2001/13685; G02F 2201/123; G02F 2201/40; G02F 2201/122; G02F 2201/12; H01L 27/124; G09G 2300/0426; G09G 2300/08; G09G 2300/0434; G09G 2300/0465
　　　See application file for complete search history.

(56) References Cited

U.S. PATENT DOCUMENTS

| | | |
|---|---|---|
| 8,542,328 B2 | 9/2013 | Chang et al. |
| 2008/0225196 A1* | 9/2008 | Kim .................. G02F 1/136259<br>349/54 |
| 2012/0050657 A1 | 3/2012 | Lin et al. |

\* cited by examiner

PIXEL STRUCTURE AND DISPLAY PANEL THEREOF

CROSS-REFERENCE TO RELATED PATENT APPLICATION

This non-provisional application claims priority to and the benefit of, pursuant to 35 U.S.C. § 119(a), patent application Ser. No. 106137797 filed in Taiwan on Nov. 1, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a pixel structure and a display panel thereof, and in particular, to a pixel structure that can improve the display quality and a display panel thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the advancement of science and technology, people have higher requirements on display panels. Light and thin sizes, high picture quality, and power saving have currently become a development trend of display panels. Generally, liquid crystal molecules of a display panel are easily affected with by crosstalk of a data electrode, and consequently the display quality is affected, causing problems such as bright lines and dark lines. Therefore, improving the crosstalk problem and increasing the aperture ratio and transmittance of the display are one of the topics that the industry has been working on.

SUMMARY

The present disclosure relates to a pixel structure and a display panel thereof, so as to improve the display quality of a display device.

According to a first aspect of the present disclosure, a pixel structure is provided, including a substrate, a scan line, a first common electrode, and a first data line. The substrate has at least a first sub pixel. The first sub pixel includes a first pixel electrode and a first active element electrically connected to the first pixel electrode. The scan line is disposed on the substrate. The first common electrode is disposed on a side of the first pixel electrode. The first common electrode includes a first segment, a second segment, and a first connection segment. The first connection segment connects the first segment to the second segment. The first segment and the second segment both extend in a first direction. The first segment and the second segment are alternately arranged in a second direction. The first direction intersects with the second direction. The first data line is disposed on the side of the first pixel electrode. The first data line includes a first section, a second section, and a second connection segment. The second connection segment connects the first section to the second section. The first section and the second section extend in the first direction. The first section and the second section are alternately arranged in the second direction. The first connection segment mutually intersects with the second connection segment. The first pixel electrode partially overlaps with the first common electrode and the first data line in a perpendicular projection direction.

According to a second aspect of the present disclosure, a display panel is provided, including a pixel structure, a second substrate, and a display medium layer. The pixel structure includes a first substrate, a scan line, a first common electrode, and a first data line. The first substrate has at least a first sub pixel. The first sub pixel includes a first pixel electrode and a first active element electrically connected to the first pixel electrode. The scan line is disposed on the first substrate. The first common electrode is disposed on a side of the first pixel electrode. The first common electrode includes a first segment, a second segment, and a first connection segment. The first connection segment connects the first segment to the second segment. The first segment and the second segment both extend in a first direction. The first segment and the second segment are alternately arranged in a second direction. The first direction intersects with the second direction. The first data line is disposed on the side of the first pixel electrode. The first data line includes a first section, a second section, and a second connection segment. The second connection segment connects the first section to the second section. The first section and the second section extend in the first direction. The first section and the second section are alternately arranged in the second direction. The first connection segment mutually intersects with the second connection segment. The first pixel electrode partially overlaps with the first common electrode and the first data line in a perpendicular projection direction. The second substrate is located opposite to the first substrate. The display medium layer is located between the first substrate and the second substrate.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
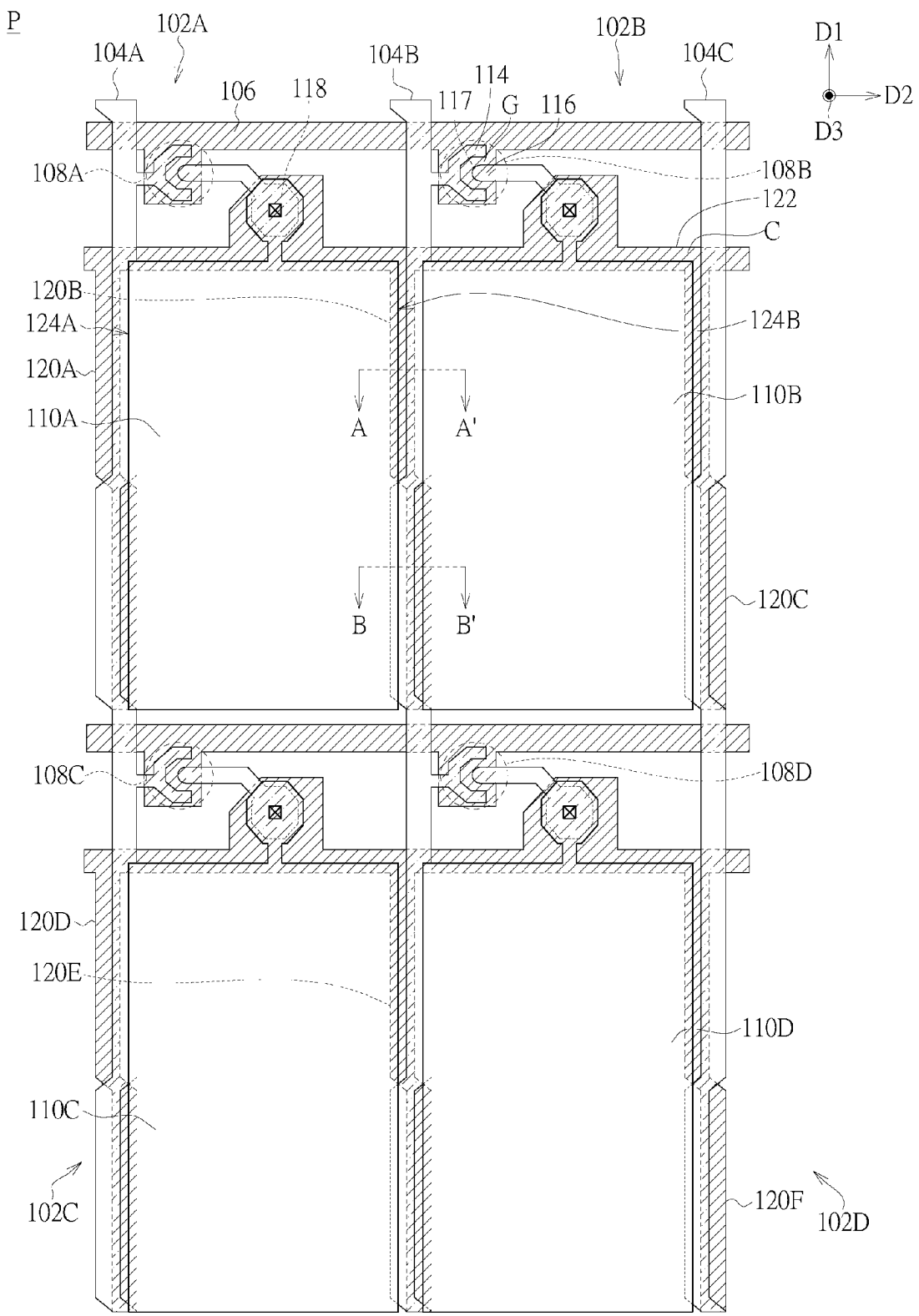
FIG. 1 is a schematic diagram of a partial pixel structure of a display panel according to an embodiment.

In embodiments, a data line and a common electrode on a same side of a pixel electrode are of a zigzag pattern in which the data line and the common electrode intersect with each other. The pixel electrode overlaps with a part of the data line and a part of the common electrode, so as to improve the display effect of a display device.

Descriptions are provided below with some embodiments. It should be noted that the present disclosure does not provide all possible embodiments, and possibly, other implementation aspects not provided in the present disclosure may also be used. Further, the dimension scale in figures is not drawn at a scale equal to that of an actual product. Therefore, this specification and content in the figures are merely intended to describe the embodiments rather than limit the protection scope of the present disclosure. In addition, descriptions in the embodiments, such as a detailed structure, a process step, and a material application, are merely used as examples rather than limitations on the protection scope of the present disclosure. Details of steps and structures in the embodiments may be modified or polished according to a requirement of an actual application process without departing from the spirit and scope of the present disclosure. Descriptions are provided below by using examples in which same/similar symbols represent same/similar elements.

It should be understood that although terms such as "first" and "second" in this specification may be used for describing various elements, components, domains, layers, and/or parts, the elements, components, domains, and/or parts should not be limited by the terms. The terms are merely used for distinguishing one element, component, domain, layer, or part from another element, component, domain, layer, or part. Therefore, a "first element", a "first component", a "first domain", a "first layer", or a "first part" discussed below may be referred to as a second element, component, domain, layer, or part without departing from teachings of this specification.

The terms used herein are merely intended to describe a particular embodiment and are not limitative. As used in this specification, unless clearly indicated in the content, "one" and "one piece" in a singular form and "the" aim to include a plural form and include "at least one". "Or" indicates "and/or". As used in this specification, the term "and/or" includes any or all combinations of one or more related listed items. It should be further understood that when being used in this specification, terms "include" and/or "comprise" specify/specifies existence of the feature, domain, entirety, step, operation, element, and/or component, but do/does not exclude existence or addition of one or more other features, domains, entireties, steps, operations, elements, components, and/or combinations thereof.

In addition, relative terms such as "below" or "bottom" and "above" or "top" in this specification may be used for describing a relationship between one element and another element, as shown in the figures. It should be understood that the relative terms aim to include different orientations of an apparatus in addition to an orientation shown in the figure. For example, if an apparatus in an accompanying drawing turns over, an element described to be below another element is oriented to be above the another element. Therefore, the exemplary term "below" may include orientations of "below" and "above". This depends on a particular orientation in the accompanying drawings. Similarly, if an apparatus in an accompanying drawing turns over, an element described to be "below" or "under" another element is oriented to be above the another element. Therefore, the exemplary term "below" or "under" may include orientations of "above" and "below".

In the accompanying drawings, for clearness, the thicknesses of a layer, a film, a panel, a domain, and the like are enlarged. In the entire specification, a same reference numeral indicates a same element. It should be understood that when an element such as a layer, a film, a domain, or a substrate is referred to as being "on" another element or being "connected" to another element, the element may be directly on the another element or connected to the another element, or an intermediate element may exist. On the contrary, when an element is referred to as being "directly on another element" or "directly connected to" another element, no intermediate element exists. As used in this specification, "connect" may be physically and/or electrically connected. However, "electrically connect" means that another element exists between two elements.

"Approximately" or "substantially" used in this specification includes an average value of the value and a particular value determined by a person of ordinary skill in the art in an acceptable deviation range, and a discussed measurement and a particular quantity of errors related to the measurement (that is, a limitation of a measurement system) are considered. For example, "approximately" may indicate to be in one or more standard deviations of the value, or in ±30%, ±20%, ±10%, or ±5%. Further, for "approximately" or "substantially" used in this specification, a relatively acceptable deviation range or standard deviation may be selected according to the optical property, the etching property, or another property, and one standard deviation may not be used for all properties.

Unless otherwise defined, all terms (including technical and scientific terms used in this specification have the same meaning as that understood by a person of ordinary skill in the art. It should be further understood that terms defined in a usually used dictionary should be explained to have a consistent meaning with that in the related art and the context of this specification, and not be explained to have an ideal or excessively formal meaning, unless clearly defined in this specification.

Figure 2:
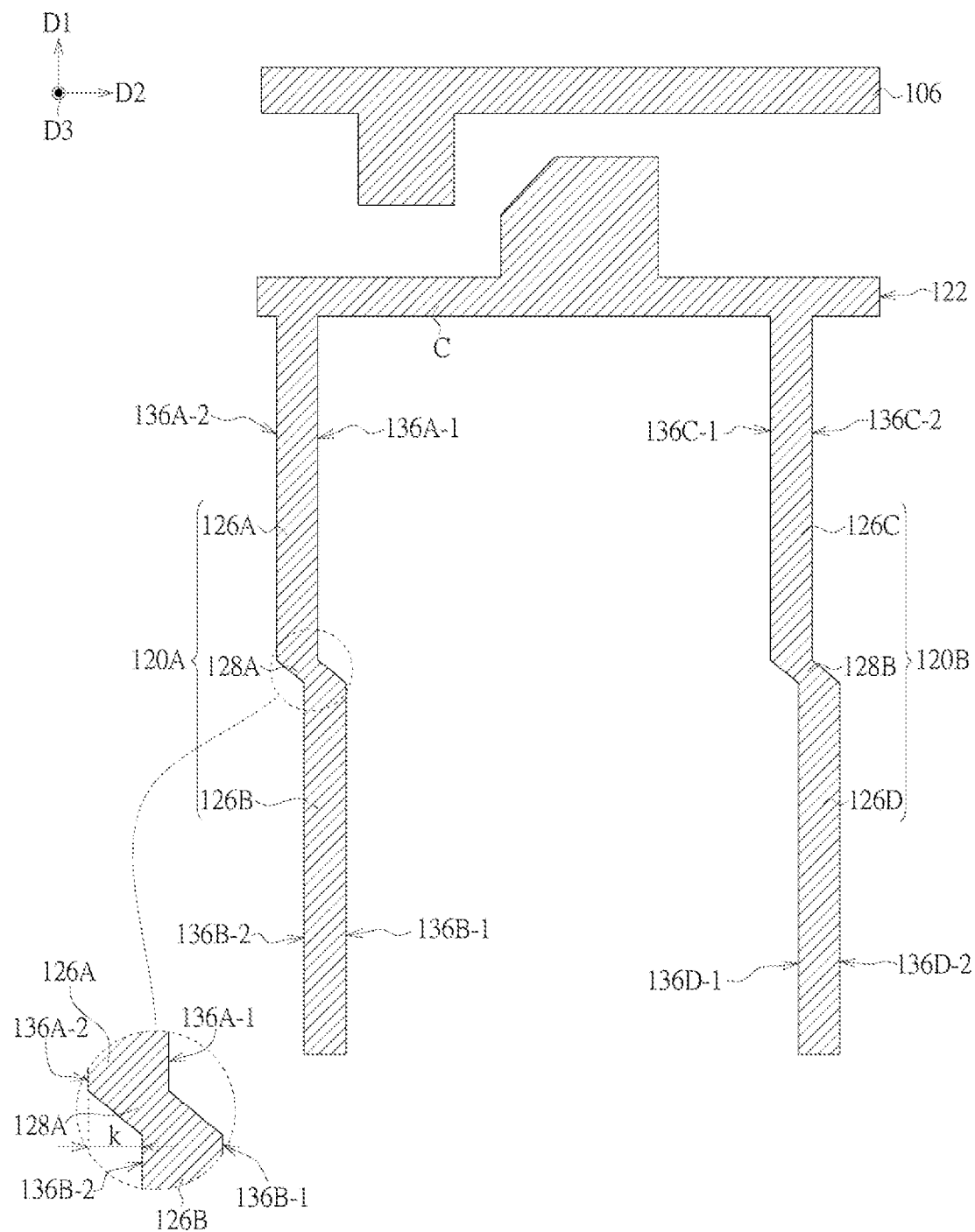
FIG. 2 is a schematic diagram of a scan line and a common electrode of a single sub pixel according to an embodiment.
Figure 3:
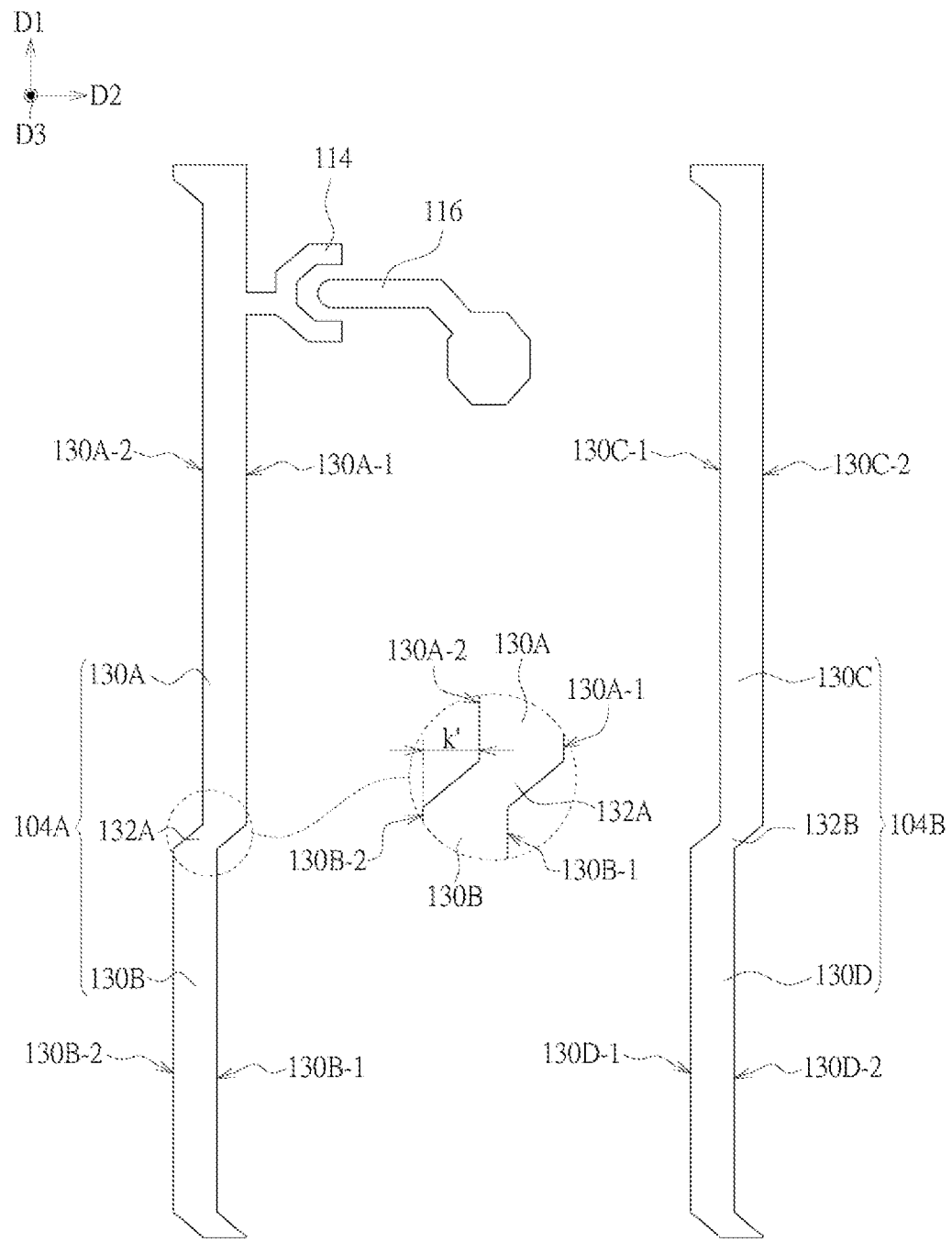
FIG. 3 is a schematic diagram of a data line, a source electrode, and a drain electrode of a single sub pixel according to an embodiment.
Figure 4:
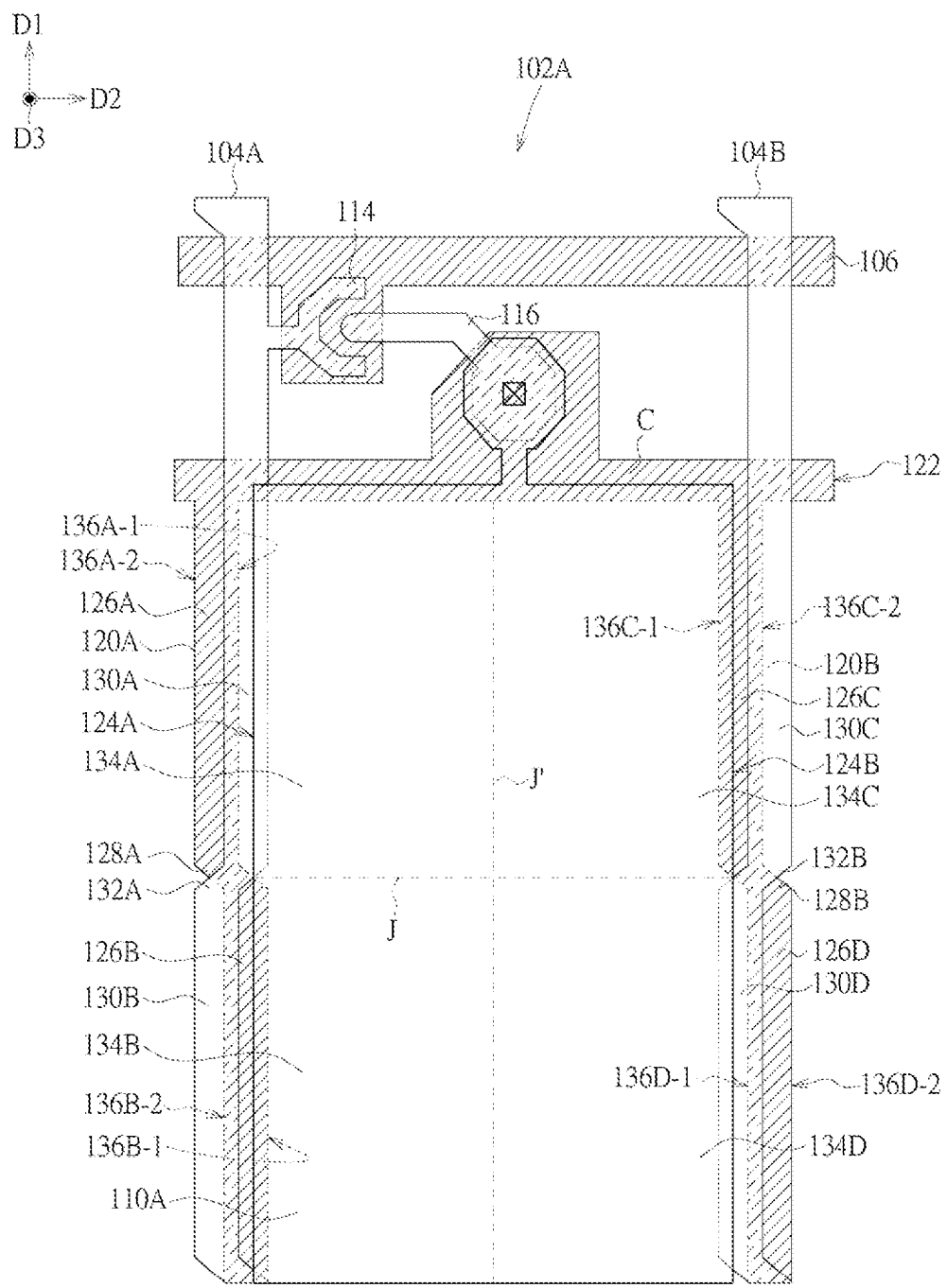
FIG. 4 is a schematic diagram of a pixel structure of a single sub pixel according to an embodiment.
Figure 5:
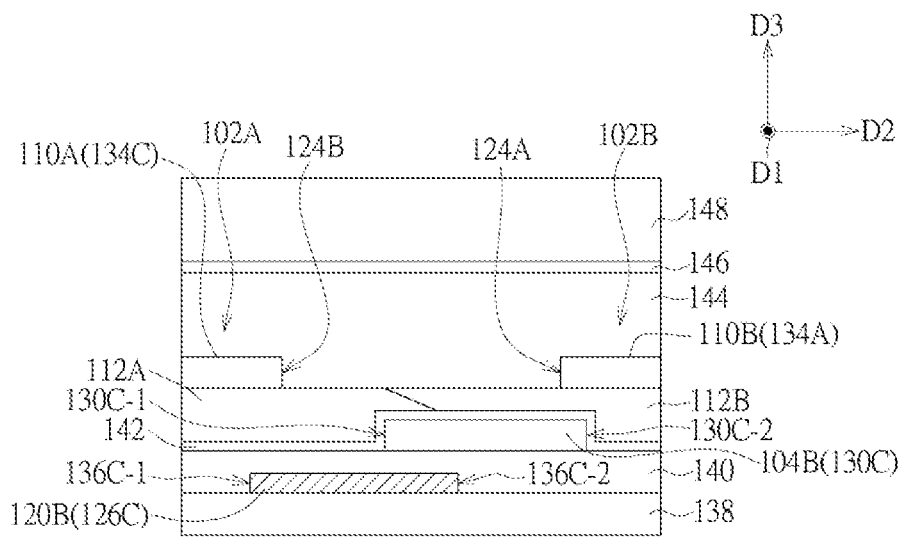
FIG. 5 is a sectional view of the pixel structure in FIG. 1 along a sectional line A-A.
Figure 6:
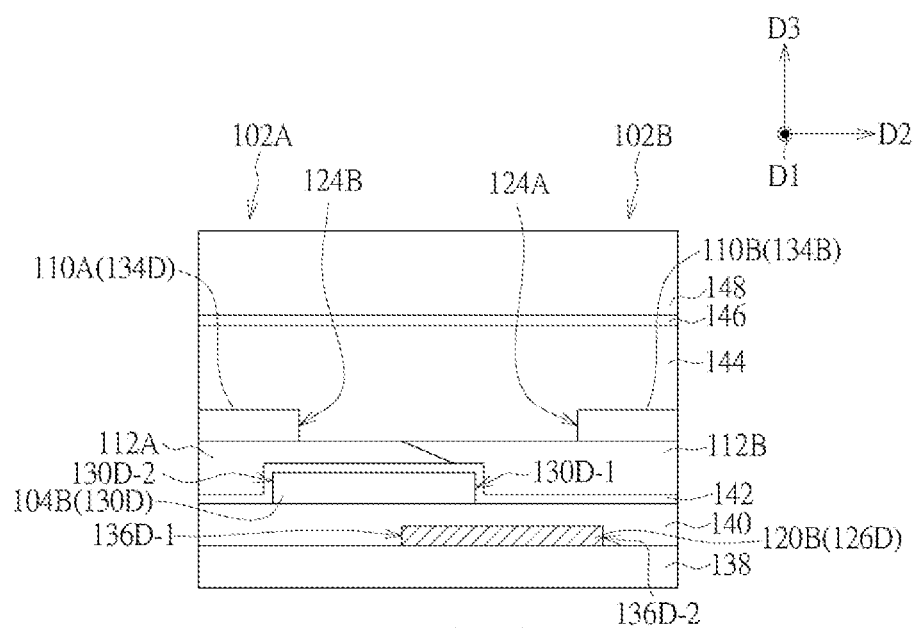
FIG. 6 is a sectional view of the pixel structure in FIG. 1 along a sectional line B-B'.

FIG. 1 to FIG. 6 show an embodiment of the present disclosure. FIG. 1 is a schematic top view of a partial pixel structure of a display panel according to an embodiment. FIG. 2 is a top view of a scan line and a common electrode of a single sub pixel according to an embodiment. FIG. 3 is a top view of a data line, a source electrode, and a drain electrode of a single sub pixel according to an embodiment. FIG. 4 is a schematic diagram of a pixel structure of a single sub pixel according to an embodiment. FIG. 5 is a sectional view of the pixel structure in FIG. 1 along a line AA'. FIG. 6 is a sectional view of the pixel structure in FIG. 1 along a line BB'.

Referring to FIG. 1, a pixel structure P includes a plurality of sub pixels, for example, four sub pixels 102A, 102B, 102C, and 102D, but is not limited thereto. The plurality of sub pixels 102A, 102B, 102C, and 102D may be separately arranged in a first direction D1 and a second direction D2. The first direction D1 intersects with the second direction D2. For example, the first direction D1 is a direction Y, and the second direction D2 is a direction X substantially perpendicular to the direction Y. However, the present disclosure is not limited thereto. The sub pixels 102A, 102B, 102C, and 102D respectively include active elements 108A, 108B, 108C, and 108D and pixel electrodes 110A, 110B, 110C, and 110D, and include color resistors (for brevity, only a color resistor 112A of the sub pixel 102A and a color resistor 112B of the sub pixel 102B are shown in FIG. 5 and FIG. 6, and color resistors of other sub pixels may be obtained by analogy.) The pixel electrodes 110A, 110B, 110C, and 110D each have opposite sides 124A and 124B (for example, for positions of the opposite sides 124A and 124B, refer to a position of the pixel electrode 110A of the sub pixel 102A in FIG. 1). The sides 124A and 124B may be separately substantially parallel to the first direction D1, and the active element (for example, the active element 108A of the sub pixel 102A) is located in the second direction D2. This is merely an example, and the present disclosure is not limited thereto. In another embodiment, the sides 124A and 124B may be separately substantially parallel to the second direction D2, and the active element (for example, the active element 108A of the sub pixel 102A) is located in the first direction D1. The active elements 108A, 108B, 108C, and 108D separately include a source electrode 114, a drain electrode 116, a semiconductor layer 117, and a gate electrode G. The gate electrode G of each of the active elements 108A, 108B, 108C, and 108D is electrically connected to a corresponding scan line 106. The semiconductor layer 117 of each of the active elements 108A, 108B, 108C, and 108D is located between the source electrode 114 and the gate electrode G and between the drain electrode 116 and the gate electrode G. The drain electrode 116 of each of the active elements 108A, 108B, 108C, and 108D may be electrically connected to the corresponding pixel electrode 110A, 110B, 110C, or 110D. For example, the drain electrode 116 of each of the active elements 108A, 108B, 108C, and 108D may be electrically connected to the corresponding pixel electrode 110A, 110B, 110C, or 110D by using a contact hole 118. The contact hole 118 runs through a gate electrode insulation layer (not shown). The active elements 108A, 108B, 108C, and 108D in this embodiment are described by using an example in which the semiconductor layer 117 is located above the gate electrode G (for example, a bottom-gate thin-film transistor (bottom-gate TFT)). However, the present disclosure is not limited thereto. In another embodiment, the active elements 108A, 108B, 108C, and 108D may alternatively be a top-gate thin-film transistor (top-gate TFT), for example, the semiconductor layer 117 is located below the gate electrode G, or may be a thin-film transistor of another suitable type. The material of the semiconductor layer 117 includes polycrystalline silicon, microcrystalline silicon, amorphous silicon, monocrystalline silicon, a carbon nanotube, an organic semiconductor material, an oxide semiconductor, or another suitable material. In this embodiment, a black matrix (BM) may be selectively configured or not configured for the pixel structure P to cover the scan line 106 and the active element 108.

In the pixel structure shown in FIG. 1, the sub pixels 102A, 102B, 102C, and 102D have approximately the same element configuration. For example, a first common electrode 120A, a second common electrode 120B, and other common electrode such as common electrodes 120C, 120D, 120E, and 120F are disposed on a side of the pixel electrodes 110A, 110B, 110C, and 110D of the sub pixels 102A, 102B, 102C, and 102D respectively in the same pattern. A first data line 104A, a second data line 104B, and other data lines such as a data line 104C are disposed on a side of the pixel electrodes 110A, 110B, 110C, and 110D of the sub pixels 102A, 102B, 102C, and 102D respectively in the same pattern. In an embodiment, the source electrodes 114 of the sub pixels 102A and 102C that are arranged in the same direction (for example, the first direction D1) extend from a same side of a same data line (also referred to as non-interlace configuration). For example, the source electrodes 114 of the sub pixel 102A and the sub pixel 102C both extend from a right side of the first data line 104A, and the source electrodes 114 of the sub pixel 102B and the sub pixel 102D both extend from a right side of the second data line 104B.

FIG. 2 is a schematic diagram of a scan line and a common electrode of a single sub pixel according to an embodiment. FIG. 3 is a schematic diagram of a data line, a source electrode, and a drain electrode of a single sub pixel according to an embodiment. FIG. 4 is a schematic diagram of a pixel structure of a single sub pixel according to an embodiment. Referring to FIG. 2 and FIG. 4 first, for example, the scan line 106 and a common electrode 122 are preferably formed by a first metal layer (M1). However, the present disclosure is not limited thereto. In an embodiment, the common electrode 122 of the sub pixel 102A may include the first common electrode 120A. The first common electrode 120A includes a first segment 126A, a second segment 126B, and a first connection segment 128A connected between the first segment 126A and the second segment 126B.

The first segment 126A of the first common electrode 120A includes a first side 136A-1 and a second side 136A-2 that are opposite to each other. The second segment 126B of the first common electrode 120A includes a first side 136B-1 and a second side 136B-2 that are opposite to each other. The first segment 126A and the second segment 126B of the first common electrode 120A may substantially extend in the first direction D1, and may deflect (or namely, bend) by using the first connection segment 128A to be alternately arranged (or namely, staggeredly arranged) in the second direction D2. Therefore, the segment setting of the first common electrode 120A may mean that the first common electrode 120A has a zigzag pattern. The first segment 126A is farther away from the pixel electrode 110A compared with the second segment 126B, and the second segment 126B is closer to the pixel electrode 110A compared with the first segment 126A. For example, there is an offset distance k (FIG. 2) between the second side 136A-2 of the first segment 126A and the second side 136B-2 of the second segment 126B in the second direction D2, and there may also be an substantially equal offset distance k between the first side 136A-1 of the first segment 126A and the first side 136B-1 of the second segment 126B.

Refer to FIG. 3 and FIG. 4. In an embodiment, for example, the first data line 104A, the source electrode 114, and the drain source 116 may be formed by a second metal layer (M2), and may be separate from the first metal layer M1 by using an insulation layer (for example, the insulation layer 140 in FIG. 4 or FIG. 5). The first data line 104A includes a first section 130A, a second section 130B, and a second connection segment 132A connected between the first section 130A and the second section 130B. The first section 130A has a first side 130A-1 and a second side 130A-2, and the second section 130B has a first side 130B-1 and a second side 130B-2. The first section 130A and the second section 130B of the first data line 104A may substantially extend in the first direction D1, and may deflect (or namely, bend) by using the second connection segment 132A to be alternately arranged (or namely, staggeredly arranged) in the second direction D2. Therefore, the segment setting of the first data line 104A may mean that the first data line 104A has a zigzag pattern. The first section 130A is closer to the pixel electrode 110A compared with the second section 130B, and the second section 130B is farther away from the pixel electrode 110A compared with the first section 130A.

Referring to FIG. 2 and FIG. 4 again, preferably, the common electrode 122 of the sub pixel 102A may further include a second common electrode 120B. In some embodiments, preferably, the common electrode 122 may further include a common electrode connection segment C and the common electrode connection segment C may connect the first common electrode 120A to the second common electrode 120B. However, the present disclosure is not limited thereto. The second common electrode 120B includes a third segment 126C, a fourth segment 126D, and a third connection segment 128B connected between the third segment 126C and the fourth segment 126D. Similarly, the third segment 126C of the second common electrode 120B includes a third side 136C-1 and a fourth side 136C-2 that are opposite to each other. The fourth segment 126D of the second common electrode 120B includes a third side 136D-1 and a fourth side 136D-2 that are opposite to each other. The third segment 126C and the fourth segment 126D of the second common electrode 120B may substantially extend in the first direction D1, and may deflect (or namely, bend) by using the third connection segment 128B to be alternately arranged (or namely, staggeredly arranged) in the second direction D2. Therefore, the segment setting of the second common electrode 120B may mean that the second common electrode 120B has a zigzag pattern. The third segment 126C is closer to the pixel electrode 110A compared with the fourth segment 126D, and the fourth segment 126D is farther away from the pixel electrode 110A compared with the third segment 126C. The first connection segment 128A may be substantially parallel to the third connection segment 128B. For example, similar to the second side 136A-2 of the first segment 126A and the second side 136B-2 of the second segment 126B, there may be an offset distance k between the fourth side 136C-2 of the third segment 126C and the fourth side 136D-2 of the fourth segment 126D in the second direction D2. Similar to the second side 136A-2 of the first segment 126A and the second side 136B-2 of the second segment 126B, there is an equal offset distance k between the third side 136C-1 of the third segment 126C and the third side 136D-1 of the fourth segment 126D. However, a value of the offset distance k between the third segment 126C and the fourth segment 126D may be substantially the same as or different from a value of the offset distance k between the first segment 126A and the second segment 126B. The present disclosure is not limited thereto.

Referring to FIG. 3 and FIG. 4 again, in an embodiment, the sub pixel 102A may further include a second data line 104B. For example, the first data line 104A and the second data line 104B may be formed by the second metal layer (M2), and may be separated from the first metal layer M1 by using the insulation layer (for example, the insulation layer 140 in FIG. 4 or FIG. 5). The second data line 104B includes a third section 130C, a fourth section 130D, and a fourth connection segment 132B connected between the third section 130C and the fourth section 130D. The first section 130A has the first side 130A-1 and the second side 130A-2, the second section 130B has the first side 130B-1 and the second side 130B-2, the third section 130C has a third side 130C-1 and a fourth side 130C-2, and the fourth section 130D has a third side 130D-1 and a fourth side 130D-2.

Similarly, the third section 130C and the fourth section 130D of the second data line 104B may substantially extend in the first direction D1, and may deflect (or namely, bend) by using the fourth connection segment 132B to be alternately arranged (or namely, staggeredly arranged) in the second direction D2. Therefore, the segment setting of the second data line 104B may mean that the second data line 104B has a zigzag pattern. The third section 130C is farther away from the pixel electrode 110A compared with the fourth section 130D, and the fourth section 130D is closer to the pixel electrode 110A compared with the third section 130C. The second connection segment 132A may be substantially parallel to the fourth connection segment 132B. For example, there is an offset distance k' (FIG. 3) between the second side 130A-2 of the first section 130A and the second side 130B-2 of the second section 130B in the second direction D2, and there may also be an substantially equal offset distance k' between the first side 130A-1 of the first section 130A and the first side 130B-1 of the second section 130B. Similarly, there is also an offset distance k' between the second side 130C-2 of the third section 130C and the second side 130D-2 of the fourth section 130D in the second direction D2. A value of the offset distance k' may be substantially the same as or different from the value of the foregoing offset distance k. The present disclosure is not limited thereto.

In an embodiment, referring to FIG. 1 and FIG. 4, domains of the pixel electrodes 110A, 110B, 110C, and 110D may be distinguished according to liquid crystal falling directions. For example, at least one of the pixel electrodes 110A, 110B, 110C, and 110D may include at least four alignment domains, and liquid crystal falling directions of the four alignment domains are different. For example, the pixel electrode 110A shown in FIG. 4 may be divided into at least four domains substantially having a same area, such as a first alignment domain 134A, a second alignment domain 134B, a third alignment domain 134C, and a fourth alignment domain 134D, and the four domains respectively correspond to different liquid crystal falling directions. However, the present disclosure is not limited thereto, and an area of at least one domain may be differently designed. In another embodiment, at least one of the pixel electrodes 110A, 110B, 110C, and 110D may not have four alignment domains. In other words, the pixel electrodes 110A, 110B, 110C, and 110D may have a single alignment domain or two or more alignment domains. A quantity of alignment domains may be selectively designed according to an actual requirement.

Referring to FIG. 4, for example, the pixel electrode 110A includes the two sides 124A and 124B that are opposite to each other, and includes the first data line 104A and the second data line 104B. The side 124A of the pixel electrode 110 is adjacent to the first data line 104A and the first common electrode 120A. The side 124B of the pixel electrode 110A is adjacent to the second data line 104B and the second common electrode 120B. The first connection segment 128A of the first common electrode 120A and the second connection segment 132A of the first data line 104A mutually intersect and overlap with each other in a third direction D3 (which is substantially perpendicular to the first direction D1 and the second direction D2, that is, perpendicularly projected in a direction of a first substrate 138). The side 124A of the pixel electrode 110A overlaps with a part of the first common electrode 120A and a part of the first data line 104A. For example, the side 124A of the pixel electrode 110A may partially overlap with the first section 130A of the first data line 104A and the second segment 126B of the first common electrode 120A, the side 124A of the pixel electrode 110A may not overlap with the second section 130B of the first data line 104A and the first segment 126A of the first common electrode 120A, and the side 124A of the pixel electrode 110A may selectively partially overlap or not overlap with the second connection segment 132A of the first data line 104A and/or the first connection segment 128A of the first common electrode 120A. The side 124B of the pixel electrode 110A overlaps with a part of the second common electrode 120B and a part of the second data line 104B. For example, the side 124B of the pixel electrode 110A may partially overlap with the fourth section 130D of the second data line 104B and the third segment 126C of the second common electrode 120B, the side 124B of the pixel electrode 110A may not overlap with the third section 130C of the second data line 104B and the fourth segment 126D of the second common electrode 120B, and the side 124B of the pixel electrode 110A may selectively partially overlap or not overlap with the fourth connection segment 132B of the second data line 104B and/or the third connection segment 128B of the second common electrode 120B. The pixel electrode 110A has center lines J and J' that approximately divides the pixel electrode 110A into four substantially equal domains, such as the first alignment domain 134A, the second alignment domain 134B, the third alignment domain 134C, and the fourth alignment domain 134D. For example, the first alignment domain 134A may partially overlap with the first section 130A of the first data line 104A and not overlap with the first segment 126A of the first common electrode 120A. The second alignment domain 134B may partially overlap with the second segment 126B of the first common electrode 120A and not overlap with the second section 130B of the first data line 104A. The third alignment domain 134C may partially overlap with the third segment 126C of the second common electrode 120B and not overlap with the third section 130C of the second data line 104B. The fourth alignment domain 134D may partially overlap with the fourth section 130D of the second data line 104B and not overlap with the fourth segment 126D of the second common electrode 120B. An overlap domain of the first connection segment 128A and the second connection segment 132A may substantially correspond to a junction of the first alignment domain 134A and the second alignment domain 134B of the pixel electrode 110A. However, the present disclosure is not limited thereto. An overlap domain of the third connection segment 128B and the fourth connection segment 132B may substantially correspond to a junction of the third alignment domain 134C and the fourth alignment domain 134D of the pixel electrode 110A. However, the present disclosure is not limited thereto.

Preferably, the first section 130A of the first data line 104A may overlap with the first side 136A-1 of the first segment 126A of the first common electrode 120A closer to the pixel electrode 110A, and not overlap with the second side 136A-2 of the first segment 126A farther away from the pixel electrode 110A. Further, the second section 130B of the first data line 104A may overlap with the second side 136B-2 of the second segment 126B of the first common electrode 120A farther away from the pixel electrode 110A, and not overlap with the first side 136B-1 of the second segment 126B closer to the pixel electrode 110A. The third section 130C of the second data line 104B may overlap with the fourth side 136C-2 of the third segment 126C of the second common electrode 120B farther away from the pixel electrode 110A, and not overlap with the third side 136C-1 of the third segment 126C closer to the pixel electrode 110A. Further, the fourth section 130D of the second data line 104B may overlap with the third side 136D-1 of the fourth segment 126D of the second common electrode 120B closer to the pixel electrode 110A, and may not overlap with the fourth side 136D-2 of the fourth segment 126D farther away from the pixel electrode 110A.

Referring to FIG. 5 and FIG. 6, FIG. 5 is a sectional view of the pixel structure in FIG. 1 along a sectional line A-A'. FIG. 6 is a sectional view of the pixel structure in FIG. 1 along a sectional line B-B'. The third segment 126C or the fourth segment 126D of the second common electrode 120B is disposed on the first substrate 138. The insulation layer 140 is disposed on the second common electrode 120B. The third section 130C or the fourth section 130D of second data line 104B is disposed on the insulation layer 140. An insulation layer 142 covers the second data line 104B. In another embodiment, the second data line 104B may not be covered by the insulation layer 142. The color resistors 112A and 112B are respectively disposed on the sub pixels 102A and 102B, and the color resistors 112A and 112B are disposed on the insulation layer 142. The pixel electrodes 110A and 110B are disposed on the color resistors. For example, the pixel electrode 110A and the pixel electrode 110B are respectively disposed on the sub pixels 102A and 102B, and are respectively disposed on the color resistor 112A and the color resistor 112B. A display medium layer 144 is disposed between the first substrate 138 and a second substrate 148 that are oppositely disposed. The display medium layer 144 may include a non-self-luminous display medium material, for example, a liquid crystal layer. An electrode film 146 may be selectively disposed on an inner surface of the second substrate 148. However, the present disclosure is not limited thereto. In another embodiment, the electrode film 146 may not be disposed on the inner surface of the second substrate 148. In an embodiment, the common electrode 22 and the electrode film 146 on the second substrate 148 are applied with substantially a same voltage. For example, the electrode film 146 serves as a common electrode and is applied with a common voltage, and the common electrode is also applied with the common voltage. The present disclosure is not limited thereto. The common electrode may also be referred to as an array common electrode. As shown in FIG. 1 and FIG. 5, for example, the third alignment domain 134C of the pixel electrode 110A of the sub pixel 102A may overlap with the third segment 126C of the second common electrode 120B, and not overlap with the third section 130C of the second data line 104B. The first alignment domain 134A of the pixel electrode 110B of the sub pixel 102B may overlap with the third section 130C of the second data line 104B, and not overlap with the third segment 126C of the second common electrode 120B. As shown in FIG. 1 and FIG. 6, the fourth alignment domain 134D of the pixel electrode 110A of the sub pixel 102A may overlap with the fourth section 130D of the second data line 104B, and not overlap with the fourth segment 126D of the second common electrode 120B. The second alignment domain 134B of the pixel electrode 110B of the sub pixel 102B may overlap with the fourth segment 126D of the second common electrode 120B, and not overlap with the fourth section 130D of the second data line 104B.

In this embodiment, the data line and the common electrode on the same side of the pixel electrode (using the second data line 104B and the second common electrode 120B on the side 124B of the pixel electrode 110A as an example) are of a zigzag pattern in which the data line and the common electrode intersect with each other. The data line and the common electrode are separately designed to partially overlap with the pixel electrode, and may achieve at least one of the following effects. The common electrode (for example, the second common electrode 120B) and the electrode film 146 are both applied with a common voltage. Therefore, the common electrode and the electrode film 146 have substantially a same potential. Therefore, molecules of the display medium layer 144 above a part of the common electrode (120B) not covered by the data line (for example, a part of the third segment 126C of the second common electrode 120B not covered by the third section 130C of the second data line 104B shown in FIG. 5), for example, liquid crystal molecules of a liquid crystal layer, may remain in an original state. In addition, when the data line transfers a pixel voltage (especially a high-potential voltage) of another sub pixel, because the common electrode (for example, the second common electrode 120B) and the electrode film 146 have substantially the same potential, an arrangement state (for example, a molecule tilt angle) of the molecules of the display medium layer 144 (for example, the liquid crystal molecules of the liquid crystal layer) is not greatly affected. In this way, a phenomenon of crosstalk caused by the pixel voltage transferred by the data line to the another sub pixel may be effectively avoided. In addition, an overlap area between the data line and the pixel electrode may be relatively small (for example, only the fourth section 130D of the second data line 104B overlaps with the fourth alignment domain 134D of the pixel electrode 110A, and the third section 130C of the second data line 104B does not overlap with the pixel electrode 110A). Therefore, a coupling capacitance (Cpd) between the pixel electrode and the data line may be relatively small, so that a phenomenon of crosstalk due to that a bias voltage of the pixel electrode is affected by voltage coupling of the data line can also be avoided. In this way, a problem of bright lines and dark lines caused on a display picture can be effectively resolved. Light shielding may be performed, by using the common electrode (for example, the second common electrode 120B), on an edge part of the pixel electrode not covered by the data line, and the setting of a black matrix on the data line (for example, the second data line 104B) may be saved, thereby improving the aperture ratio of the pixel structure. Further, an overlap part of color resistors (for example, the color resistor 112A and 112B) may be covered by the data line (for example, the second data line 104B) and/or the common electrode (for example, the second common electrode 120B) used as light shielding elements/a light shielding element, so as to avoid light leakage at the overlap part of the color resistors (for example, the color resistors 112A and 112B). In addition, a configuration design in which the data line partially overlaps with the common electrode can improve the aperture ratio and light penetration rate of the display panel.

The present disclosure is not limited thereto. In another embodiment, the data line and the common electrode may alternatively be configured in another manner to partially overlap with the pixel electrode, so as to effectively avoid the phenomenon of crosstalk caused by the pixel voltage transferred by the data line to the another pixel, effectively avoid the problem of bright lines and dark lines, and maintain effects of the aperture ratio and the light penetration rate of the pixel.

Figure 7:
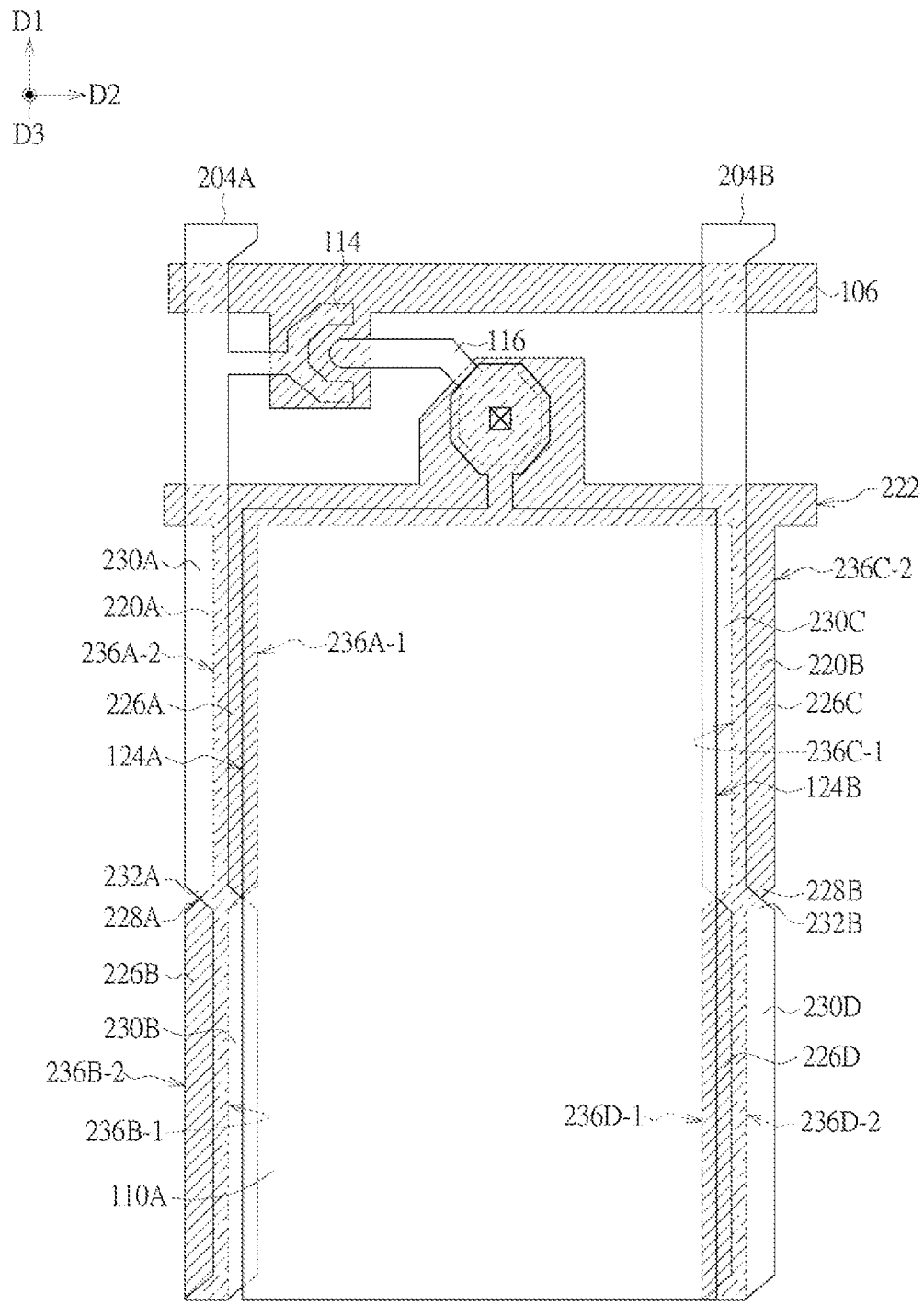
FIG. 7 is a schematic diagram of a pixel structure of a single sub pixel according to another embodiment.

For example, FIG. 7 is a schematic diagram of a pixel structure of a single sub pixel according to another embodiment. Differences in configurations between data lines 204A and 204B, common electrodes 220A and 220B, and a pixel electrode 110A and those in FIG. 4 are described below. Directions of zigzag patterns of the first data line 204A and the second data line 204B in FIG. 7 are reverse to directions of the zigzag patterns of the first data line 104A and the first data line 104B in FIG. 4. In other words, an extension direction of a second connection segment 232A of the first data line 204A in FIG. 7 mutually intersects with an extension direction of the second connection segment 132A of the first data line 104A in FIG. 4. An extension direction of a fourth connection segment 232B of the second data line 204B in FIG. 7 mutually intersects with an extension direction of the fourth connection segment 132B of the second data line 104B in FIG. 4. In addition, directions of zigzag patterns of a first common electrode 220A and a second common electrode 220B of a common electrode 222 in FIG. 7 are reverse to directions of the zigzag patterns of the first common electrode 120A and the second common electrode 120B in FIG. 4. In other words, an extension direction of a first connection segment 228A of the first common electrode 220A of the common electrode 222 in FIG. 7 mutually intersects with an extension direction of the first connection segment 128A of the first common electrode 120A of the common electrode 122 in FIG. 4. An extension direction of a third connection segment 228B the second common electrode 220B in FIG. 7 mutually intersects with an extension direction of the third connection segment 128B of the second common electrode 120B of the common electrode 122 in FIG. 4.

Referring to FIG. 7, the first connection segment 228A of the first common electrode 220A overlaps and intersects with the second connection segment 232A of the first data line 204A in a perpendicular projection direction of a substrate (a third direction D3), so that a first section 230A of the first data line 204A is located on a second side 236A-2 of a first segment 226A of the first common electrode 220A. For example, the first section 230A of the first data line 204A may overlap with the second side 236A-2 of the first segment 226A of the first common electrode 220A in the perpendicular projection direction of the substrate (the third direction D3) and not overlap with a first side 236A-1 of the first segment 226A of the first common electrode 220A. A second section 230B of the first data line 204A is located on a first side 236B-1 of a second segment 226B of the first common electrode 220A. For example, the second section 230B of the first data line 204 may overlap with the first side 236B-1 of the second segment 226B of the first common electrode 220A in the perpendicular projection direction of the substrate (the third direction D3) and not overlap with a second side 236B-2 of the second segment 226B of the first common electrode 220A. In addition, an overlap and intersection configuration between the third connection segment 228B of the second common electrode 220B and the fourth connection segment 232B of the second data line 204B makes a third section 230C of the second data line 204B be located on a third side 236C-1 of a third segment 226C of the second common electrode 220B. For example, the third section 230C of the second data line 204B overlaps with the third side 236C-1 of the third segment 226C of the second common electrode 220B in the perpendicular projection direction of the substrate (the third direction D3) and does not overlap with a fourth side 236C-2 of the third segment 226C of the second common electrode 220B. A fourth section 230D of the second data line 204B is located on a fourth side 236D-2 of a fourth segment 226D of the second common electrode 220B. In other words, the fourth section 230D of the second data line 204B may overlap with the fourth side 236D-2 of the fourth segment 226D of the second common electrode 220B in the perpendicular projection direction of the substrate (the third direction D3) and not overlap with a third side 236D-1 of the fourth segment 226D of the second common electrode 220B.

Figure 8:
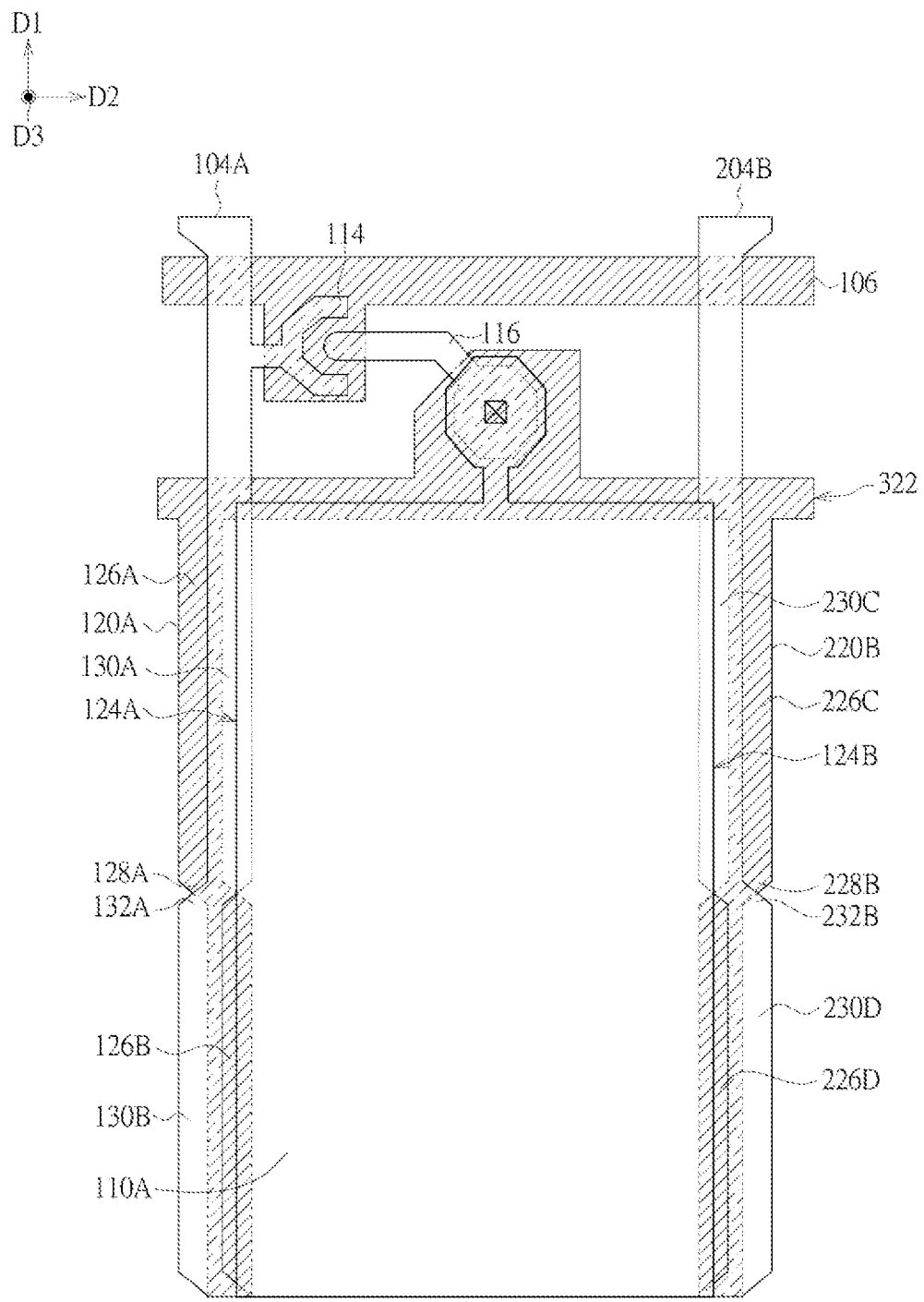
FIG. 8 is a schematic diagram of a pixel structure of a single sub pixel according to another embodiment.
Figure 9:
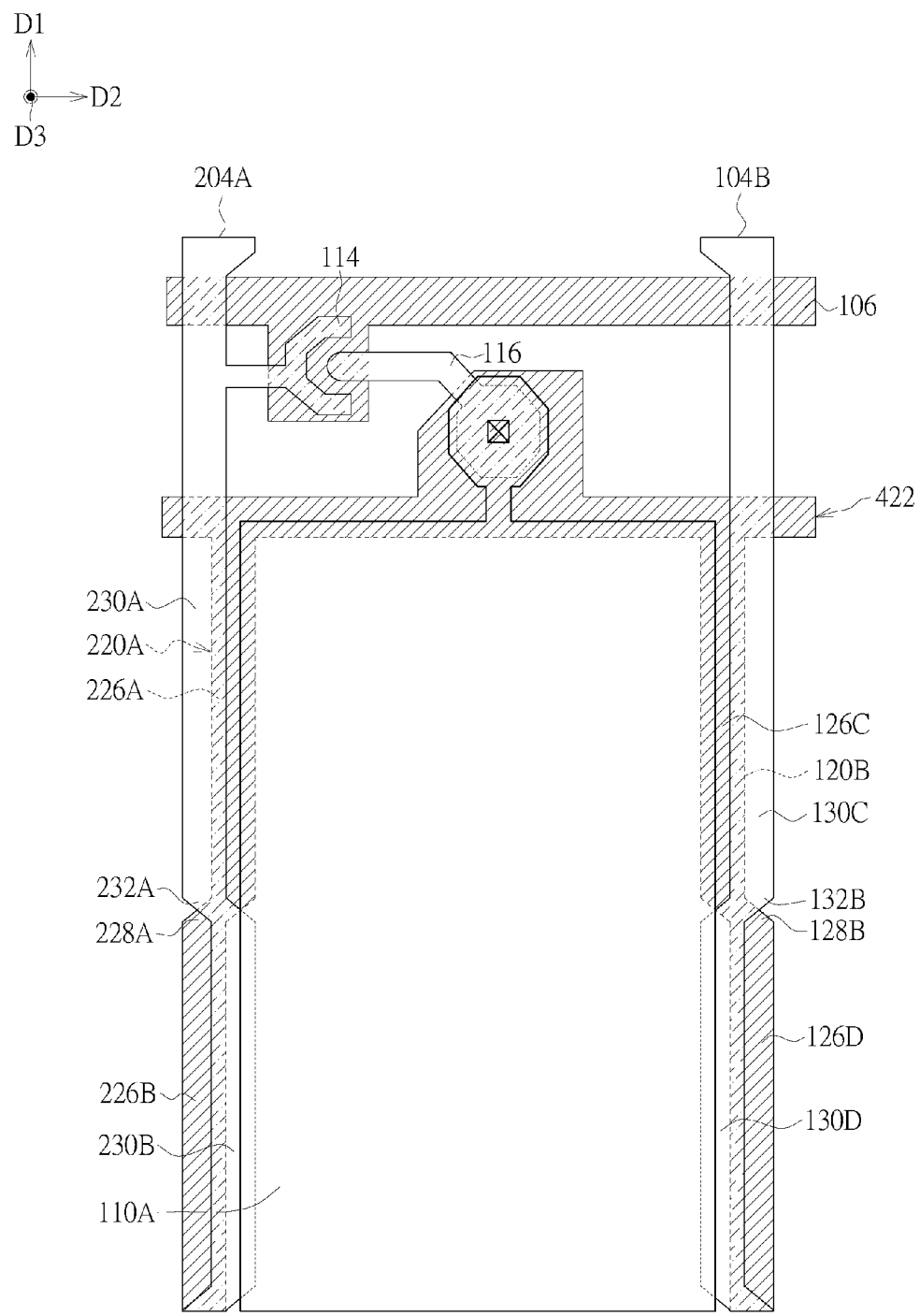
FIG. 9 is a schematic diagram of a pixel structure of a single sub pixel according to another embodiment.

Referring to FIG. 7, FIG. 8, and FIG. 9, an intersection position of the first connection segment of the first common electrode and the second connection segment of the first data line and an intersection position of the third connection segment of the second common electrode and the fourth connection segment of the second data line approximately divide sides 124A and 124B of the pixel electrode 110A into an upper part and a lower part.

As shown in FIG. 7, the upper part of the side 124A of the pixel electrode 110A may partially overlap with the first segment 226A of the first common electrode 220A in the third direction D3 and not overlap with the first section 230A of the first data line 204A. The lower part of the side 124A of the pixel electrode 110A partially overlaps with the second section 230B of the first data line 204A in the third direction D3 and does not overlap with the second segment 226B of the first common electrode 220A. The upper part of the side 124B of the pixel electrode 110A may partially overlap with the third section 230C of the second data line 204B in the third direction D3 and not overlap with the third segment 226C of the second common electrode 220B. The lower part of the side 124B of the pixel electrode 110A partially overlaps with the fourth segment 226D of the second common electrode 220B in the third direction D3 and does not overlap with the fourth section 230D of the second data line 204B.

FIG. 8 is a schematic diagram of a pixel structure of a single sub pixel according to another embodiment. FIG. 8 shows another implementation of the data lines, the common electrodes, and the pixel electrodes in FIG. 4 and FIG. 7. In this embodiment, as shown in FIG. 8, an upper part of a side 124A of a pixel electrode 110A partially overlaps with a first section 130A of a first data line 204A in a third direction D3 and does not overlap with a first segment 126A of a first common electrode 120A. A lower part of the side 124A of the pixel electrode 110A partially overlaps with a second segment 126A of the first common electrode 120A in the third direction D3 and does not overlap with a second section 130B of a first data line 104A. An upper part of a side 124B of the pixel electrode 110A may partially overlap with a third section 230C of a second data line 204B in the third direction D3 and not overlap with a third segment 226C of a second common electrode 220B. A lower part of the side 124B of the pixel electrode 110A may partially overlap with a fourth segment 226D of the second common electrode 220B in the third direction D3 and not overlap with a fourth section 230D of the second data line 204B.

FIG. 9 is a schematic diagram of a pixel structure of a single sub pixel according to another embodiment. In this embodiment, as shown in FIG. 9, an upper part of a side 124A of a pixel electrode 110A may partially overlap with a first segment 226A of a first common electrode 220A in a third direction D3 and not overlap with a first section 230A of a first data line 204A. A lower part of the side 124A of the pixel electrode 110A may partially overlap with a second section 230B of the first data line 204A in the third direction D3 and not overlap with a second segment 22B of the first common electrode 220A. An upper part of a side 124B of the pixel electrode 110A may partially overlap with a third segment 126C of a second common electrode 220B in the third direction D3 and not overlap with a third section 130C of a second data line 104B. A lower part of the side 124B of the pixel electrode 110A may partially overlap with a fourth section 130D of the second data line 104B in the third direction D3 and not overlap with a fourth segment 126D of the second common electrode 220B.

Overlap and intersection positions between the common electrodes and the data lines on the two sides of the pixel electrode (for example, connection segments of the common electrodes and the data lines) are not limited to substantially same positions (or heights) on the corresponding sub pixel. In another embodiment, any quantity of overlap and intersection parts between the common electrodes and the data lines may be arbitrarily disposed at other proper positions at the two sides of the pixel electrode. In another embodiment, the common electrode and the data line of the pixel structure may be disposed on one side of the sub pixel arbitrarily or in a combined manner according to the concept of this embodiment of the present disclosure, and the pixel structure is not limited to the disclosed configuration manner.

Figure 10:
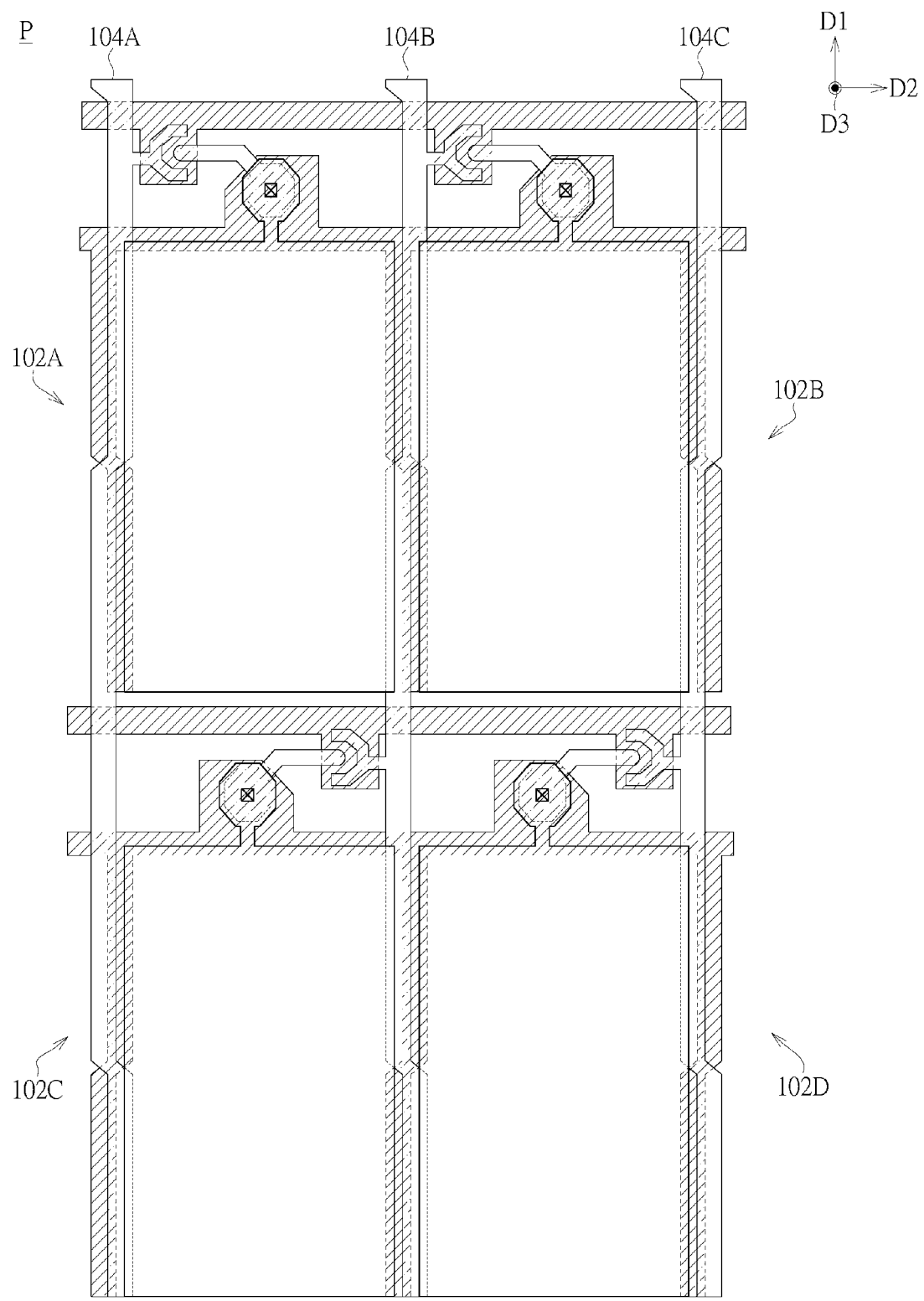
FIG. 10 is a schematic diagram of a partial pixel structure of a display panel according to another embodiment.

For example, referring to FIG. 10, a difference between a pixel structure in FIG. 10 and the pixel structure shown in FIG. 1 is that the pixel structure in this embodiment is configured in an interlace manner. For example, a source electrode 114 of a sub pixel 102A extends from a right side of a first data line 104A, and a source electrode 114 of a sub pixel 102C sequentially arranged in a first direction D1 extends from a left side of a second data line 104B. A source electrode 114 of a sub pixel 102B extends from a right side of the second data line 104B, and a source electrode 114 of a sub pixel 102D sequentially arranged in the first direction D1 extends from a left side of a third data line 104C. Configurations of other elements are obtained by analogy.

Figure 11:
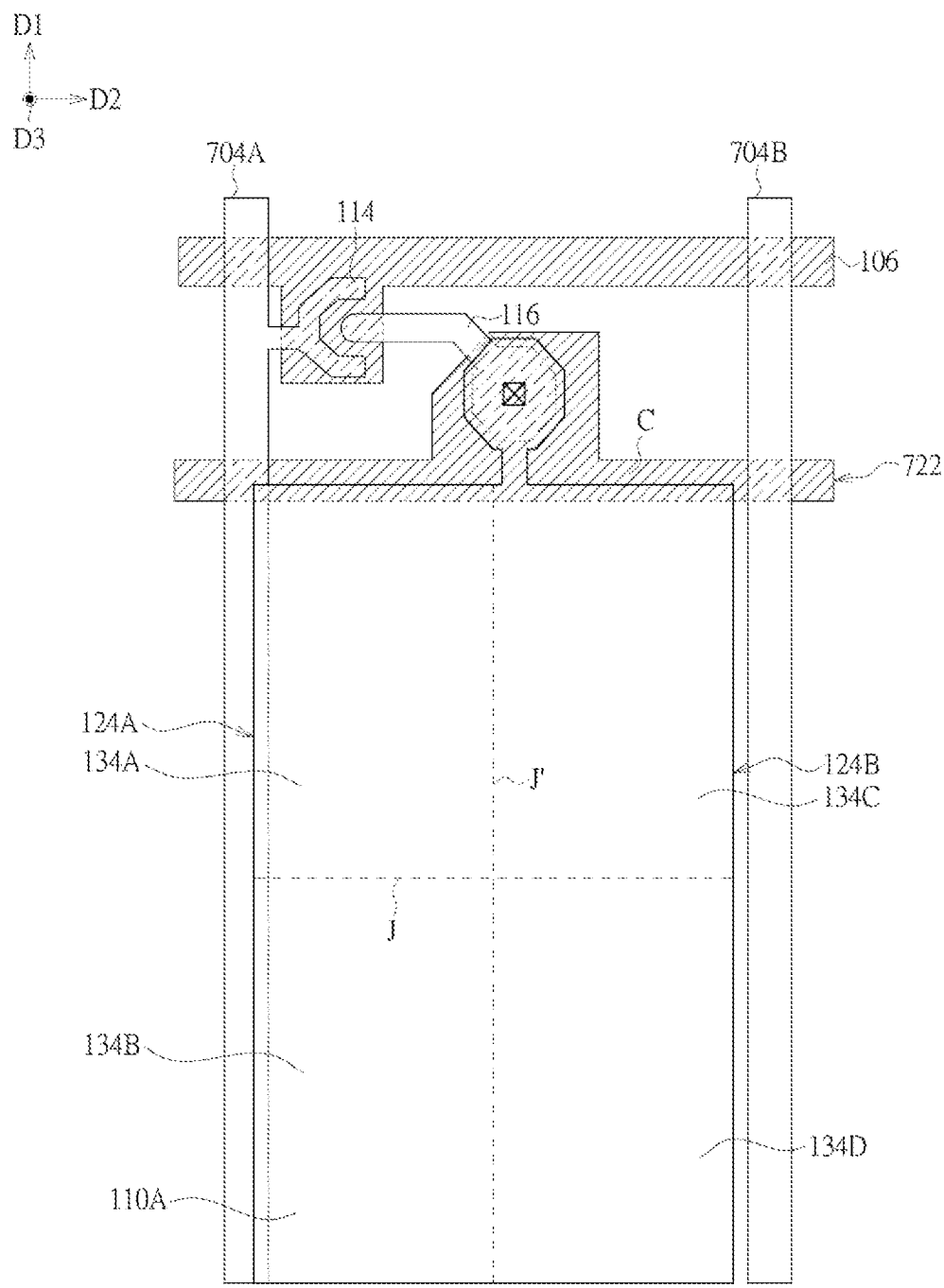
FIG. 11 is a schematic diagram of a pixel structure of a single sub pixel according to a compared embodiment.

FIG. 11 is a schematic diagram of a pixel structure of a single sub pixel according to a compared embodiment. A difference with the embodiment in FIG. 4 is that a common electrode 722 in this compared embodiment does not have the first common electrode 120A and the second common electrode 120B in FIG. 4, and a first data line 704A and a second data line 704B do not have a zigzag pattern. There is substantially a same aperture ratio in the embodiment in FIG. 4 and this compared embodiment in FIG. 11, but there is a lower coupling resistance (Cpd) between the pixel electrode and the data line in the embodiment in FIG. 4 compared with this compared embodiment, as shown in Table 1.

TABLE 1

1.

| | Embodiment (FIG. 4) | Compared embodiment (FIG. 11) |
|---|---|---|
| Cpd/Ctotal | 3.81% | 5.77% |

In conclusion, although the present disclosure is disclosed above with the embodiments, the embodiments are not intended to limit the present disclosure. A person of ordinary skill in the art to which the present disclosure belongs may make various modifications and polishing without departing from the spirit and scope of the present disclosure. Therefore, the protection scope of the present disclosure shall be subject to the protection scope of the claims.

What is claimed is:

1. A pixel structure, comprising:
   a substrate, having at least a first sub pixel, wherein the first sub pixel comprises a first pixel electrode and a first active element electrically connected to the first pixel electrode;
   a scan line, disposed on the substrate;
   a first common electrode, disposed on a side of the first pixel electrode, wherein the first common electrode comprises a first segment, a second segment, and a first connection segment, the first connection segment connects the first segment to the second segment, the first segment and the second segment both extend in a first direction, the first segment and the second segment are alternately arranged in a second direction, and the first direction intersects with the second direction; and
   a first data line, disposed on the side of the first pixel electrode, wherein the first data line comprises a first section, a second section, and a second connection segment, the second connection segment connects the first section to the second section, the first section and the second section extend in the first direction, the first section and the second section are alternately arranged in the second direction, the first connection segment mutually intersects with the second connection segment, and the first pixel electrode partially overlaps with the first common electrode and the first data line in a perpendicular projection direction.

2. The pixel structure according to claim 1, wherein the first segment and the second segment each have a first side and a second side, the first section is located on the first side of the first segment, and the second section is located on the second side of the second segment.

3. The pixel structure according to claim 1, further comprising:
   a second common electrode, disposed on another side of the first pixel electrode, wherein the second common electrode comprises a third segment, a fourth segment, and a third connection segment, the third connection segment connects the third segment to the fourth segment, the third segment and the fourth segment extend in the first direction, and the third segment and the fourth segment are alternately arranged in the second direction; and
   a second data line, disposed on the another side of the first pixel electrode, wherein the second data line comprises a third section, a fourth section, and a fourth connection segment, the fourth connection segment connects the third section to the fourth section, the third section and the fourth section extend in the first direction, the third section and the fourth section are alternately arranged in the second direction, and the third connection segment mutually intersects with the fourth connection segment.

4. The pixel structure according to claim 3, wherein the first connection segment is substantially parallel to the third connection segment, and the second connection segment is substantially parallel to the fourth connection segment.

5. The pixel structure according to claim 4, wherein a part of the side of the first pixel electrode partially overlaps with the first section and the second connection segment of the first data line in the perpendicular projection direction, and another part of the side of the first pixel electrode partially overlaps with the second segment and the first connection segment of the first common electrode in the perpendicular projection direction; and a part of the another side of the first pixel electrode partially overlaps with the third segment and the third connection segment of the second common electrode in the perpendicular projection direction, and another part of the another side of the first pixel electrode partially overlaps with the fourth section and the fourth connection segment of the second data line in the perpendicular projection direction.

6. The pixel structure according to claim 4, wherein the first segment and the second segment each have a first side and a second side, the first section is located on the first side of the first segment, the second section is located on the second side of the second segment; and the third segment and the fourth segment each have a third side and a fourth side, the third section is located on the third side of the third segment, and the fourth section is located on the fourth side of the fourth segment.

7. The pixel structure according to claim 4, wherein a part of the side of the first pixel electrode partially overlaps with the first segment and the first connection segment of the first common electrode in the perpendicular projection direction, and another part of the side of the first pixel electrode partially overlaps with the second section and the second connection segment of the first data line in the perpendicular projection direction; and a part of the another side of the first pixel electrode partially overlaps with the third section and the fourth connection segment of the second data line in the perpendicular projection direction, and another part of the another side of the first pixel electrode partially overlaps with the fourth segment and the third connection segment of the second common electrode in the perpendicular projection direction.

8. The pixel structure according to claim 4, wherein the first segment and the second segment each have a first side and a second side, the first section is located on the second side of the first segment, the second section is located on the first side of the second segment; and the third segment and the fourth segment each have a third side and a fourth side, the third section is located on the fourth side of the third segment, and the fourth section is located on the third side of the fourth segment.

9. The pixel structure according to claim 3, wherein the first connection segment intersects with an extension direction of the third connection segment, and the second connection segment intersects with an extension direction of the fourth connection segment.

10. The pixel structure according to claim 9, wherein a part of the side of the first pixel electrode partially overlaps with the first section and the second connection segment of the first data line in the perpendicular projection direction, and another part of the side of the first pixel electrode partially overlaps with the second segment and the first connection segment of the first common electrode in the perpendicular projection direction; and a part of the another side of the first pixel electrode partially overlaps with the third section and the fourth connection segment of the second data line in the perpendicular projection direction, and another part of the another side of the first pixel electrode partially overlaps with the fourth segment and the third connection segment of the second common electrode in the perpendicular projection direction.

11. The pixel structure according to claim 9, wherein the first segment and the second segment each have a first side and a second side, the first section is located on the first side of the first segment, the second section is located on the second side of the second segment; and the third segment and the fourth segment each have a third side and a fourth side, the third section is located on the fourth side of the third segment, and the fourth section is located on the third side of the fourth segment.

12. The pixel structure according to claim 9, wherein a part of the side of the first pixel electrode partially overlaps with the first segment and the first connection segment of the first common electrode in the perpendicular projection direction, and another part of the side of the first pixel electrode partially overlaps with the second section and the second connection segment of the first data line in the perpendicular projection direction; and a part of the another side of the first pixel electrode partially overlaps with the third segment and the third connection segment of the second common electrode in the perpendicular projection direction, and another part of the another side of the first pixel electrode partially overlaps with the fourth section and the fourth connection segment of the second data line in the perpendicular projection direction.

13. The pixel structure according to claim 9, wherein the first segment and the second segment each have a first side and a second side, the first section is located on the second side of the first segment, and the second section is located on the first side of the second segment; and the third segment and the fourth segment each have a third side and a fourth side, the third section is located on the third side of the third segment, and the fourth section is located on the fourth side of the fourth segment.

14. The pixel structure according to claim 3, wherein the substrate further comprises a second sub pixel, the second sub pixel comprises a second pixel electrode and a second active element, the second pixel electrode is electrically connected to the second active element, the second common electrode and the second data line are disposed between the first pixel electrode and the second pixel electrode.

15. The pixel structure according to claim 14, wherein the first active element is electrically connected to the first data line, and the second active element is electrically connected to the second data line.

16. The pixel structure according to claim 3, further comprising:
a second sub pixel, disposed on the substrate, wherein the second sub pixel comprises a second pixel electrode and a second active element, the second pixel electrode is electrically connected to the second active element, and the scan line is disposed between the first pixel electrode and the second pixel electrode.

17. The pixel structure according to claim 16, wherein the first active element is electrically connected to the first data line, and the second active element is electrically connected to the second data line.

18. A display panel, comprising:
the pixel structure according to claim 1, wherein the substrate is a first substrate;
a second substrate, located opposite to the first substrate; and
a display medium layer, located between the first substrate and the second substrate.

* * * * *